US010717018B2

United States Patent
Hellenga

(10) Patent No.: US 10,717,018 B2
(45) Date of Patent: *Jul. 21, 2020

(54) KIT FOR ELECTRIFYING AN ASSEMBLY OF BRICKS IN A BRICK BUILDING SYSTEM

(71) Applicant: Hellenga Projects, Inc., Elmhurst, IL (US)

(72) Inventor: Rachel Hellenga, Elmhurst, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/212,103

(22) Filed: Dec. 6, 2018

(65) Prior Publication Data

US 2019/0105580 A1 Apr. 11, 2019

Related U.S. Application Data

(63) Continuation of application No. 15/694,643, filed on Sep. 1, 2017, now Pat. No. 10,179,295, which is a continuation of application No. 15/260,438, filed on Sep. 9, 2016, now Pat. No. 9,782,686.

(60) Provisional application No. 62/219,514, filed on Sep. 16, 2015.

(51) Int. Cl.
| | |
|---|---|
| *A63H 33/04* | (2006.01) |
| *H05K 1/03* | (2006.01) |
| *A63H 33/08* | (2006.01) |
| *H05K 1/02* | (2006.01) |
| *H05K 1/09* | (2006.01) |

(52) U.S. Cl.
CPC .......... *A63H 33/042* (2013.01); *A63H 33/08* (2013.01); *H05K 1/0286* (2013.01); *H05K 1/038* (2013.01); *H05K 1/09* (2013.01)

(58) Field of Classification Search
CPC .... A63H 33/00; A63H 33/042; A63H 33/086; H01B 5/00; H01B 5/14; H05K 1/00; H05K 1/038; H05K 1/092
USPC .................. 446/91, 120–122, 117, 175, 219; 200/307; 339/210 R, 210 M; 439/732
See application file for complete search history.

(56) References Cited

U.S. PATENT DOCUMENTS 4,883,440 A * 11/1989 Bolli ..................... A63H 33/042
446/91
4,894,040 A * 1/1990 Bach ..................... A63H 33/042
385/147

(Continued)

*Primary Examiner* — Kien T Nguyen
(74) *Attorney, Agent, or Firm* — Run8 Patent Group, LLC; Peter Miller

(57) ABSTRACT

One variation of a conductive construction tape for electrifying a stack of bricks in a studded-brick building system includes: a tape substrate defining a first linear array of perforations that each define a circular cross-section configured to receive a stud extending from a brick in the studded-brick building system and offset from an adjacent perforation in the linear array by a standard stud offset distance between studs extending from the brick; and a conductive tape layer applied over the tape substrate; an electrically-conductive material extending along the first linear array of perforations and cooperating with the tape substrate to define a total nominal thickness less than a thickness of the studded building brick; wherein the perforated conductive tape is configured to transiently install horizontally between bricks in the stack of bricks to communicate electrical current laterally across the stack of bricks.

1 Claim, 8 Drawing Sheets

(56) References Cited

U.S. PATENT DOCUMENTS

| | | | | |
|---|---|---|---|---|
| 5,848,503 A | * | 12/1998 | Toft | A63H 33/042 52/173.1 |
| 6,585,553 B1 | * | 7/2003 | Fetridge | A63H 33/042 446/91 |
| 8,753,164 B2 | * | 6/2014 | Hansen | A63H 33/042 446/85 |
| 2004/0185745 A1 | * | 9/2004 | Reining | A63H 33/042 446/91 |
| 2011/0021107 A1 | * | 1/2011 | Nag | A63H 33/042 446/91 |

* cited by examiner

KIT FOR ELECTRIFYING AN ASSEMBLY OF BRICKS IN A BRICK BUILDING SYSTEM

CROSS-REFERENCE TO RELATED APPLICATIONS

This Application is a continuation application of U.S. patent application Ser. No. 15/694,643, filed on 1 Sep. 2017, which is a continuation of U.S. patent application Ser. No. 15/260,438, filed on 9 Sep. 2016, which claims the benefit of U.S. Provisional Application No. 62/219,514, filed on 16 Sep. 2015, all of which are incorporated in their entireties by this reference.

TECHNICAL FIELD

This invention relates generally to the field of building toys and more specifically to a new and useful kit for electrifying an assembly of bricks in a brick building system in the field of building toys.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. Kit

Figure 1:
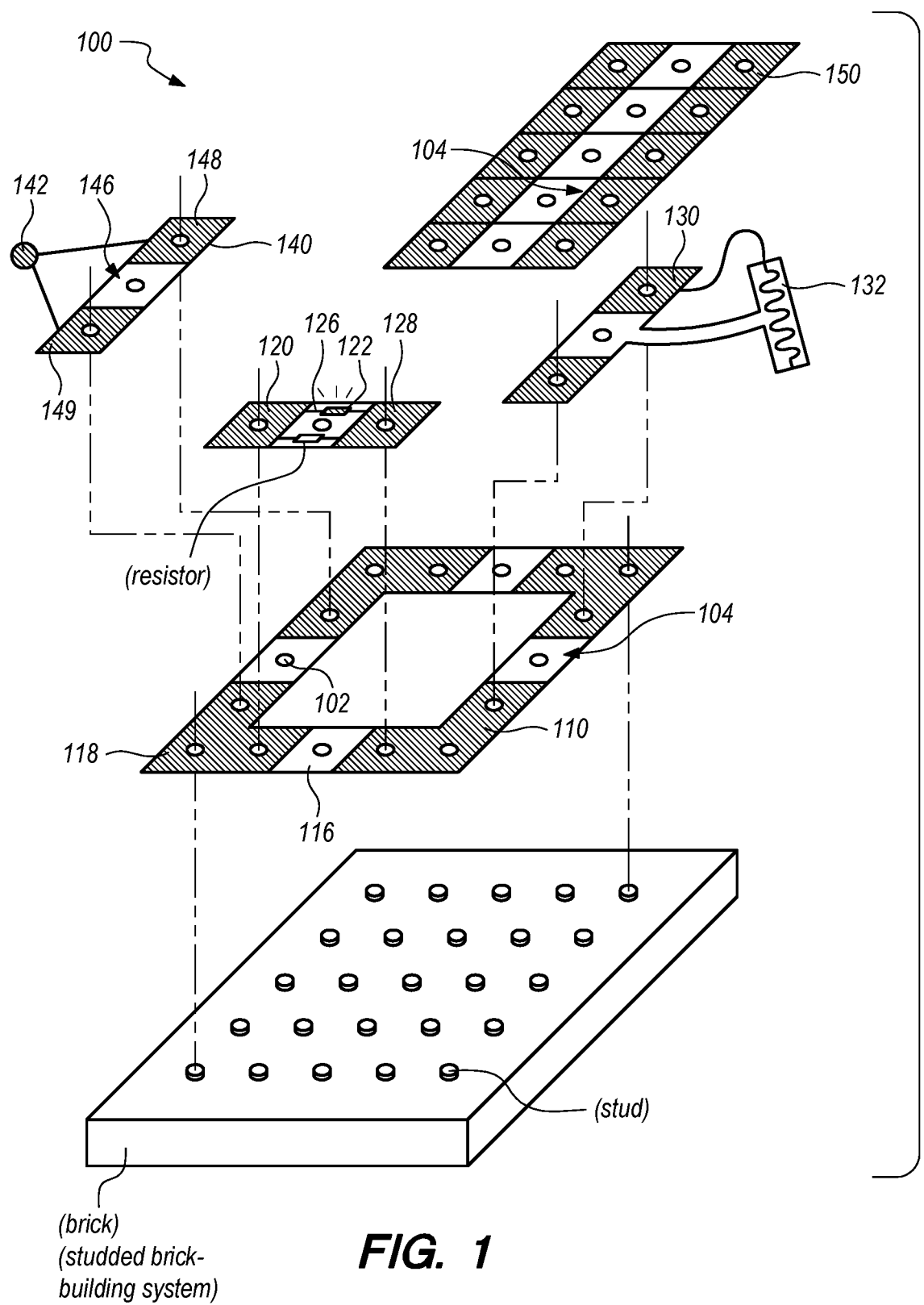
FIG. 1 is a schematic representation of a kit.

As shown in FIG. 1, a kit 100 for electrifying an assembly of bricks in a brick building system includes: a base carrier 110 including a base substrate 116 defining a set of perforations about a perimeter of the base substrate 116, and the base carrier 110 including a conductive material on the flexible substrate and encircling each perforation 102 in a subset of perforations in the set of perforations; a circuit extender 150 including an extender substrate defining a first linear array of perforations, a second linear array of perforations, a third linear array of perforations interposed between the first linear array of perforations and the second linear array of perforations, and the circuit extender 150 including a first continuous conductive trace extending along the first linear array of perforations, and a second continuous conductive trace extending along the second linear array of perforations and isolated from the first continuous conductive trace; and an actuator carrier 120 including an actuator substrate 126 defining a first perforation and a second perforation, a conductive circuit extending between the first perforation and the second perforation, and an actuator 122 connected to the actuator substrate 126 and electrically coupled to the circuit.

In the kit 100, each perforation 102 in the base carrier 110, the circuit extender 150, and the actuator carrier 120 defining a circular cross-section configured to receive a stud extending from a studded building brick; adjacent perforations in the base carrier 110, the circuit extender 150, and the actuator carrier 120 offset by a standard stud offset distance on the studded building brick; the base carrier 110, the circuit extender 150, and the actuator carrier 120 configured to transiently install between a stack of studded building bricks to form an electrical circuit; and each of the base substrate 116, the circuit substrate, and the actuator substrate 126 defining a nominal thicknesses less than a thickness of the studded building brick.

Figure 13:
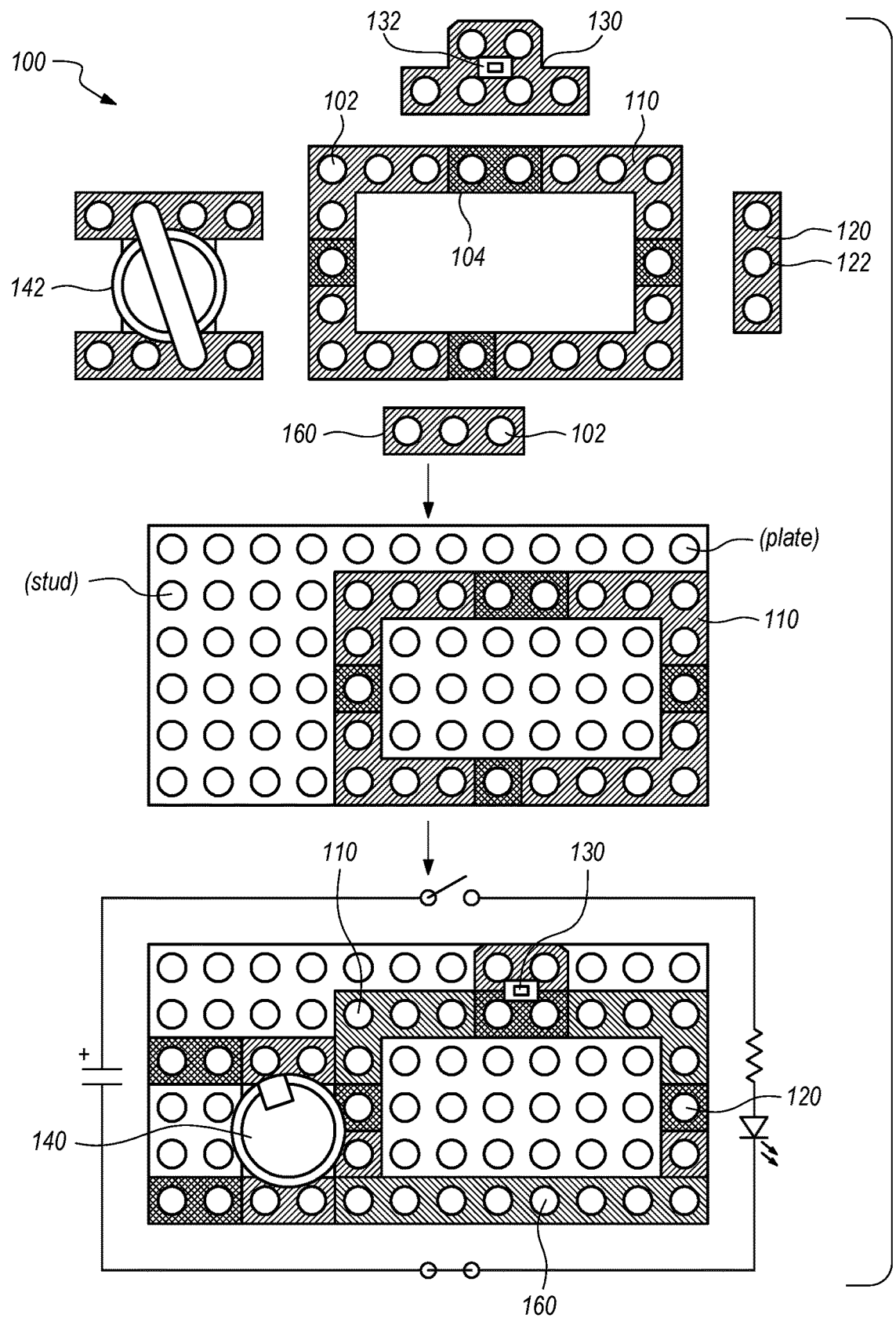
FIG. 13 is a flowchart representation of one variation of the kit.

As shown in FIGS. 1 and 13, one variation of the kit 100 for electrifying a stack of bricks in a studded-brick building system includes: a base carrier 110; a perforated conductive tape 160; and an actuator carrier 120. In this variation, the base carrier 110 includes: a base substrate 116 defining a perimeter and a group of perforations about the perimeter; and a conductive base layer 118 applied over the base substrate 116, including a conductive material, and encircling a subset of perforations in the group of perforations. The perforated conductive tape 160 includes: a tape substrate 166 defining a first linear array of perforations; and a perforated conductive layer 168 applied over the tape substrate 166, including a conductive material, and extending along the first linear array of perforations. The actuator carrier 120 includes: an actuator substrate 126 defining a first perforation and a second perforation; an actuator 122 mounted to the actuator substrate 126; and a conductive actuator layer 128 applied over the actuator substrate 126, including a conductive material, extending from the first perforation to a first terminal of the actuator 122, and extending from the second perforation to a second terminal of the actuator 122. In this variation, each perforation 102 in the group of perforations, the first linear array of perforations, the first perforation, and the second perforation: defines a circular cross-section configured to receive a stud extending from a studded building brick in the studded-brick building system; and is offset from an adjacent perforation 102 by a standard stud offset distance on the studded building brick. The base carrier 110, the perforated conductive tape 160, and the actuator carrier 120 are also configured to transiently install between the stack of bricks to form an electrical circuit; and each of the base substrate 116, the circuit substrate, and the actuator substrate 126 define a nominal thickness less than a thickness of a brick in the studded-brick building system.

2. Applications

Generally, the kit 100 includes a set of components that can be connected and installed in one plane between stacks of studded bricks—such as interlocking toy bricks that include round studs configured to lock into adjacent bricks—to form an electrical circuit. In particular, components within the kit 100 can be assembled over studs on the tops of studded building bricks in one building plane across the studded building bricks to and connected in series and/or in parallel to create an electrical circuit, as shown in FIG. 13. The kit 100 can also include a power carrier 140 and a sensor carrier 130 (e.g., a mechanical switch carrier) that, when connected to the electrical circuit, cooperate to intermittently supply power through the base carrier 110 and the extender carrier to the actuator carrier 120. For example, the actuator carrier 120 can include a light (e.g., an LED), and the kit 100 can be installed across a first assembly constructed from a set of studded bricks to light the first assembly, the first assembly can be deconstructed, and the kit 100 can be reconfigured within a second assembly constructed from the same set of studded bricks to similarly light the second assembly. The kit 100 can also include perforated conductive tape 160, and segments of perforated conductive tape 160 and/or circuit extenders can be assembled across multiple layers within an assembly of studded building bricks to extend an electrical circuit across multiple planes within the assembly.

The kit 100 includes a set of components, such as one or more base carriers, circuit extenders, actuator carriers, sensor carriers, and/or power carriers, etc. that define relatively thin, flexible structures configured for installation between two layers of stacked bricks. Each component in the kit 100 also defines one or more perforations, each perforation 102 defining a geometry that can transiently receive a stud extending from a top of a building brick. For a component in the kit 100 that defines multiple perforations in one or more arrays (e.g., a 1×8 array of perforations, a 2×4 array of perforations), the center-to-center distances between adjacent perforations can be substantially identical to a standard center-to-center distance between adjacent studs extending from the tops of such building bricks. For example, the kit 100 can be configured to interface with a building brick system that includes include 3.2 mm-tall and 9.6 mm-tall bricks with 4.8 mm-diameter cylindrical studs extending 1.7 mm above the top of each brick and offset laterally (and longitudinally, where applicable) by a center-to-center distance of 8 mm. In this example, components within the kit 100 can include substrates less than 0.15 mm thick and defining circular bores 5 mm in diameter (0.2 mm greater than the stud diameter), wherein adjacent circular bores are offset laterally (and longitudinally, where applicable) by a center-to-center distance of 8 mm. Thus, when assembled between two studded bricks stacked vertically, a component within the kit 100 can account for a substantially minimal change in the total height of the stack of studded bricks. Furthermore, to electrically couple two components within the kit 100, a perforation 102 in a first component (e.g., the base carrier 110) and a perforation 102 in a second component (e.g., the actuator carrier 120) can be installed over the same stud on a first brick, and a second brick can be installed over the first and second components and snapped into the stud, thereby compressing the first and second components around the stud to achieve reliable electrical contact between the first and second components.

The kit 100 can include any number and combination of base carriers, circuit extenders, actuator carriers, sensor carriers, power carriers, and/or segments of perforated conductive tape 160 that can be assembled and disassembled with various studded building bricks in a studded building brick system. In particular, components within the kit 100 can be assembled in various combinations over time to form electrical circuits, and the studded building bricks assembled around components in the kit 100 can form a relatively rigid structure that both supports circuits defined by the components and constrains components within the kit 100 relative to one another to ensure reliable electrical contact between adjacent components within the kit 100.

3. Base Carrier

The kit 100 includes a base carrier 110 including a base substrate 116 defining a set of perforations about a perimeter of the base substrate 116 and including a conductive material on the flexible substrate and encircling each perforation 102 in a subset of perforations in the set of perforations. Generally, the base carrier 110 includes a base substrate 116 defining a series of perforations about its perimeter and includes multiple discrete conductive traces extending across the top surface and/or across the bottom surface of the base substrate 116. Each trace on the base carrier 110 encompasses a subset of perforations along the perimeter of the base carrier 110 and can define a width approximately equivalent to the width of a single-stud-wide brick in the building brick system (hereinafter referred to as a "one-by width"). For example, a first perforation 102 in a perforated conductive strip, a circuit extender 150, or an other element within the kit 100 can be aligned within a second perforation in the base carrier 110, wherein the second perforation is encompassed by a conductive trace on the base carrier 110. In this example, the first and second perforation can be installed over a stud extending from the top of a lower brick, and the edge of an upper brick can then be installed over the base substrate 116, over the perforated conductive strip, and onto the stud on the lower brick. The stud in the lower brick can thus constrain the upper brick, and the lower corners of the upper brick can compress the perforated conductive strip onto the base substrate 116 to ensure reliable electrical contact between the conductive strip and the base substrate 116.

The base carrier 110 can thus define conductive traces that are intermittent, wherein each trace on the base substrate 116 electrically couples a discrete subset of perforations in the set of perforations in the base carrier no. Hereinafter, a "conduction exclusion zone 104" in the kit 100 is defined by an absence of conductive material (e.g., a trace) around one or more perforations on a substrate. For example, on the base carrier no, a conduction exclusion zone 104—between—traces defines an interconnect position on which an actuator carrier 120, a sensor carrier 130, a power carrier 140, or a set of perforated conductive strips can be installed to complete or extend the circuit, as shown in FIG. 1. In this example, adjacent discrete conductive traces on the perimeter of the base substrate 116 can be offset by one perforation 102 not encompassed by conductive material to define a conduction exclusion zone 104 centered on this single perforation 102 and one one-by in width. In this example, an actuator carrier 120 including an actuator substrate 126 three one-by widths in length and including a perforation 102 on each end—separated by the equivalent of twice the center-to-center distance between studs in the building bricks system (hereinafter a "stud pitch distance," which may be equivalent to the one-by width)—can then be installed across the conduction exclusion zone 104, thereby adding an actuator 122 to the circuit.

Furthermore, in the foregoing example, adjacent discrete conductive traces on the perimeter of the base substrate 116 can be offset by two perforations defining a second exclusion zone two one-bys in width, and a sensor carrier 130 including an actuator substrate 126 four one-bys in width and including a perforation 102 on each end—separated by the equivalent of three stud distances—can then be installed across the second conduction exclusion zone 104 to add a sensor (e.g., a mechanical momentary switch) to the circuit. The base carrier 110 can thus define a series of perforations about its perimeter, can include a set of discrete conductive traces, each of which electrically couples a corresponding subset of perforations in the base substrate 116 to form discrete segments that—when connected with a battery carrier, actuator carrier 120, and/or sensor carrier 130, etc.—cooperate to form an electrical circuit. The base substrate 116 can also define one or more conduction exclusion zones between adjacent conductive traces. A user can thus install various components within the kit 100 across conduction exclusion zones to complete and/or extend an electrical circuit.

The base substrate 116 can define regions within its perimeter that—when the base carrier no is installed over a brick or plate in the brick building system—traverse studs in the brick or plate but that exclude perforations aligned with such studs (hereinafter "perforation exclusion zones"). Perforation exclusion zones can define regions on the base carrier no (or on any other carrier within the kit 100 on which other components within the kit 100 cannot be installed between two or more bricks in the brick building system to extend or complete the circuit. The base substrate 116 may therefore not lie flat between studs. In one implementation, bricks or plates in the building brick system can be assembled into a perimeter brick wall defining a geometry of studs that match the geometry of perimeter perforations in the base substrate 116, and the base substrate 116 can be installed over the perimeter brick wall with the perforations in the base substrate 116 receiving studs extending from the perimeter brick wall. In this implementation, the base substrate 116 can thus define a perforation exclusion zone within its interior that bridges a void inside the perimeter brick wall, as shown in FIGS. 1 and 13.

In another implementation, the base carrier 110 includes a flexible material such that, when the base carrier 110 is installed directly over a brick or plate in the building brick system, the interior region of the base substrate 116— defining a perforation exclusion zone—can deflect over adjacent studs extending from the brick or plate below. In one example, the base carrier no includes a rectilinear base substrate 116 including a left side, a right side, an anterior side, and a posterior side. Both the left side and the right of the base substrate 116 include a linear array of perforations, wherein the centers of adjacent perforations are offset by one stud distance, as described above. There are no perforations on the anterior and posterior sides except at the corners of the base substrate 116. When the base carrier 110 is installed on a plate in the building brick system, the linear arrays of perforations on the left and right sides of the base substrate 116 are installed over corresponding arrays of studs extending from the plate. However, the lateral center-to-center distance between the left linear array and the right linear array of perforations on the base substrate 116 can be greater than the distance between the stud arrays on the plate that receive these perforations such that the interior of the base substrate 116 deflects (e.g., bows) away from the plate. A first brick can then be installed over the left linear array of perforations and the corresponding studs on the plate to lock the left side of the base substrate 116 onto the plate, and a second brick can be similarly installed over the right linear array of perforations and the corresponding studs on the plate to lock the right side of the base substrate 116 onto the plate. The interior of the base substrate 116 can thus cover studs between the left and right arrays of perforations but exclude perforations in this interior area.

Figure 7:
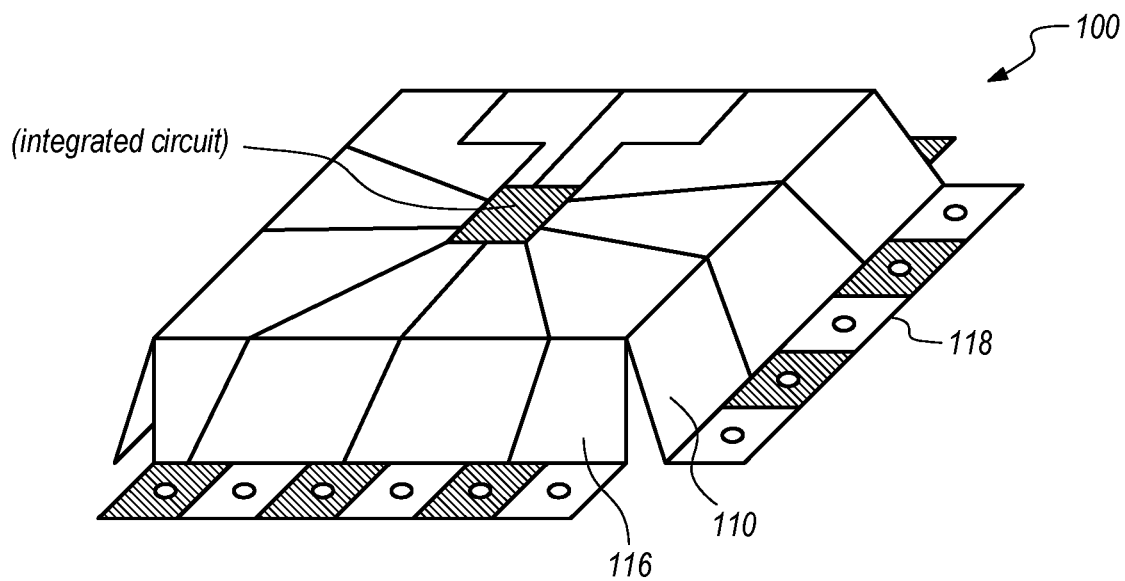
FIG. 7 is a schematic representation of one variation of the kit.

In a similar example in which the base carrier 110 includes a rectilinear base substrate including a left side, a right side, an anterior side, and a posterior side, the base substrate 116 can include a slit extending from each corner partially toward the center of the base substrate 116 to define a left dovetail, a right dovetail, an anterior dovetail, and a posterior dovetail. Each of the left, right, anterior, and posterior dovetails on the base substrate 116 can include a linear array of perforations, wherein the centers of adjacent perforations in each dovetail are offset by one stud distance. In this example, when the base carrier no is installed on a plate in the building brick system, the linear arrays of perforations on the right and left dovetails are installed over corresponding parallel arrays of studs extending from the plate. However, the lateral center-to-center distance between the left and right linear arrays of perforations on the left and right dovetails can be greater than the distance between the parallel studs arrays on the plate that receive these perforations such that the left and right dovetails deflect (e.g., bow) away from the plate in a first plane, thereby elevating the center of the base substrate 116 above adjacent studs in the plate, as shown in FIG. 7. Similarly, when the base carrier 110 is installed on the plate in the brick building system, the linear arrays of perforations on the anterior and posterior dovetails can engage corresponding parallel arrays of studs extending from the plate. However, the lateral center-to-center distance between the anterior and posterior linear arrays of perforations on the anterior and posterior dovetails can also be greater than the distance between the parallel studs arrays on the plate that receive these perforations such that the anterior and posterior dovetails deflect away from the plate in a second plane, thereby elevating the center of the base substrate 116 above adjacent studs in the plate, as shown in FIG. 7.

In the foregoing example: a first brick can then be installed over left linear array of perforations and the corresponding studs on the plate to lock the left side of the base substrate 116 onto the plate; a second brick can be installed over right linear array of perforations and the corresponding studs on the plate to lock the right side of the base substrate 116 onto the plate; a third brick can be installed over anterior linear array of perforations and the corresponding studs on the plate to lock the anterior side of the base substrate 116 onto the plate; and a fourth brick can be installed over posterior linear array of perforations and the corresponding studs on the plate to lock the posterior side of the base substrate 116 onto the plate. The interior of the base substrate 116 can thus cover studs between the left and right arrays of perforations but exclude perforations in this interior area, and the dovetails on each side of the base substrate 116 can deflect away from the adjacent plate to elevate the interior area of the base substrate 116 (a perforation exclusion zone) above studs on the adjacent plate, as shown in FIG. 7. In one example, a base carrier 110 including a processor or other integrated circuit, as described below, can define such a geometry to enable traces to be routed from perforations about the perimeter of the base carrier 110 directly to ports on the processor rather than necessitating that the processor be sufficiently small to fit between perforations or necessitating that traces be routed around perforations within the interior of the base substrate 116.

In this implementation, the center-to center distance between each stud in the brick building system can be approximately 8.0 millimeters, the vertical height of a brick in the brick building system can be approximately 3.2 millimeters, and the center to center distance between studs along opposite ends of the base carrier can be a multiple of approximately 16.0 millimeters. Thus, the base carrier can be installed: horizontally across a stud wall, as shown in FIG. 1; or vertically along the face of a stud wall by folding upper and lower edges of the base carrier 90° to meet an upper row of studs and a lower row of studs separated by a vertical distance some multiple of 16.0 millimeters.

Figure 5:
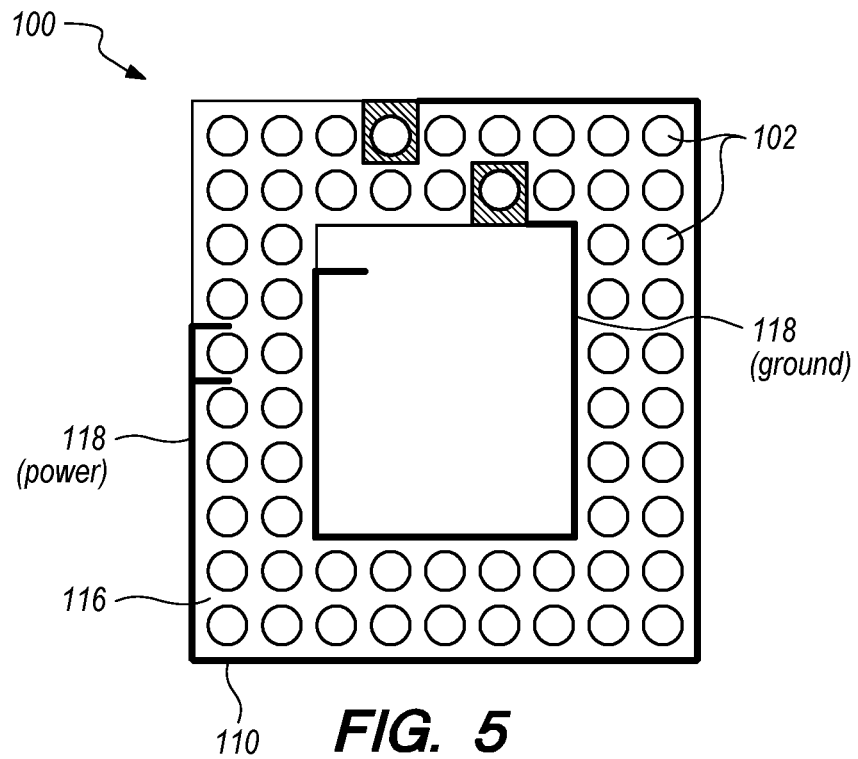
FIG. 5 is a schematic representation of one variation of the kit.

In another implementation, the base carrier no can define an outer perimeter section including perforations encompassed by conductive material, and the base carrier 110 can define an open center that lacks substrate or conductive material, as shown in FIG. 5. However, the base carrier can define any other suitable material or geometry.

In yet another implementation, the base carrier defines a solderless breadboard form including: a right column of repeated rows of two perforations with all perforations in the right column electrically connected via a conductive trace; a right-center column of repeated rows of five perforations with all perforations in each row electrically connected by a trace but with each row of perforations electrically isolated from all other rows in the right-center column; a left-center column of repeated rows of five perforations with all perforations in each row electrically connected by a trace but with each row of perforations electrically isolated from all other rows in the left-center column; and a left column of repeated rows of two perforations with all perforations in the left column electrically connected via a conductive trace. A user can thus use the base carrier as a solderless breadboard to construct a circuit over an assembly of bricks by sandwiching the base carrier and electrical components or other elements within the kit between building bricks.

4. Circuit Extender

As shown in FIG. 1, the kit 100 can also include a circuit extender 150: including an extender substrate defining a first linear array of perforations, a second linear array of perforations, a third linear array of perforations interposed between the first linear array of perforations and the second linear array of perforations; and including a first continuous conductive trace extending along the first linear array of perforations, and a second continuous conductive trace extending along the second linear array of perforations and isolated from the first continuous conductive trace. Generally, the circuit extender 150 defines two (or more) traces and functions to interface with the base carrier 110 to extend a conduction exclusion zone 104 beyond the bounds of the base carrier 110; actuator carriers, sensor carriers, and/or power carriers can then be attached to the circuit extender 150 to extend an electrical circuit beyond the base carrier 110.

Like the base carrier 110, the circuit extender 150 defines perforations offset by the stud pitch distance in the brick building system, including a two arrays (e.g., rows) of perforations encompassed by discrete traces and including an array of perforations interposed between the discrete traces and defining a conduction exclusion zone 104. The circuit extender 150 can be aligned and fixed to the base carrier 110 via studs extending from bricks below the base carrier 110; bricks installed on top of the circuit extender 150 can thus lock the circuit extender 150 to the base substrate 116. The extender can extend from the base carrier 110 to additional modules, such as additional actuator carriers, that define similar perforation patterns.

Figure 4:
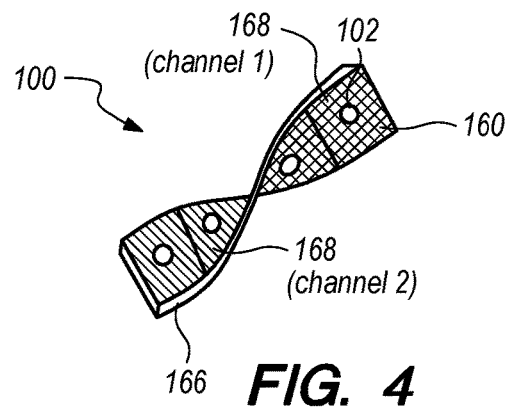
FIG. 4 is a schematic representation of one variation of the kit.

The circuit extender 150 can include an extender substrate of a flexible polymer such that the circuit extender 150 can be twisted, bent, and/or folded, etc. to reach various lateral and/or vertical positions within an assembly of bricks relative to the base substrate 116, as shown in FIG. 4. Alternatively, the extender substrate can be of a rigid polymer such that the circuit extender 150 can provide lateral and longitudinal support to actuator carriers, power carriers, conductive strips, etc. installed over the circuit extender 150. The extender substrate can also include one or more perforation exclusion zones in select regions over which other carriers are not to be installed or in select region over which the circuit extender 150 is not to be secured to a brick or plate in the brick building system.

The kit 100 can include a set of circuit extenders, wherein various circuit extenders in the set of circuit extenders define unique geometries within the set. For example, a first circuit extender 150 can define an extender substrate three one-bys in width and six one-bys in length with a first trace encompassing a left array of six perforations and a right trace encompassing a right array of six perforations. In this example, a second circuit extender 150 within the kit 100 can include an extender substrate four one-bys in width and eight one-bys in length with parallel traces offset by two rows of perforations.

As described above and shown in FIG. 2, the circuit extender 150 can include two discrete parallel traces, such as including a first trace defining a DC ground channel and a second trace defining a DC voltage supply channel. In another implementation, the circuit extender 150 includes three discrete traces, including a first trace defining a ground channel, a second trace defining a power channel, and a third trace defining a digital I/O channel. For example, in this implementation, the circuit extender 150 can include an I/O trace that connects to and communicates logic level outputs (e.g., logic level LO, logic level HI) from a sensor on a sensor carrier 130 to an input port of controller in the base carrier no and/or from the sensor carrier 130 to a digital input of an actuator on an actuator carrier 120. The I/O trace on the circuit extender 150 can also communicate digital signals from a controller in the base carrier no to digital input ports of an actuator on a connected actuator carrier 120, to a digital input port on a sensor carrier 130, etc. In another example, the circuit extender 150 can include an I/O trace that connects adjacent elements within the system to communicate analog values from a sensor on a sensor carrier 130 to a controller in the base carrier 110 or to an analog input of an actuator on an actuator carrier 120.

Figure 2:
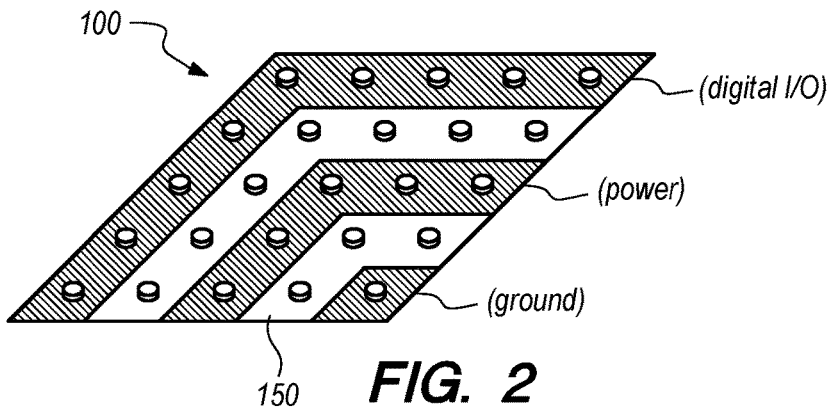
FIG. 2 is a schematic representation of one variation of the kit.

In one configuration of the foregoing implementation, the circuit extender 150 can include a rigid substrate measuring five one-bys in width by five one-bys in length and defining a set of five parallel, linear arrays (e.g., rows) of perforations in a 5×5 perforation grid. In this implementation, the circuit extender 150 can include a discrete ground traces that extend along and encompasses the leftmost perforation array, a discrete power (i.e., voltage supply) trace that extends along and encompasses the center perforation array, and a discrete digital I/O trace that extends along and encompasses the rightmost perforation array, and conduction exclusion zones extending along the left center and right-center perforation arrays to electrically isolate the ground, power, and digital I/O traces. In one variation of this configuration, the circuit extender 150 can includes discrete traces that define 90° turns. For example, as shown in FIG. 2: the ground trace can encompass a (1,1) perforation on the 5×5 perforation grid; the power trace can extend linearly from the (3,1) perforation to the (3,3) perforation and from the (3,3) perforation to the (1,3) perforation; and the digital I/O trace can extend linearly from the (5,1) perforation to the (5,5) perforation and from the (5,5) perforation to the (1,5) perforation. In this configuration, the circuit extender 150 can be rotated 90° to switch from a 90°-left circuit extender 150 to a 90°-right circuit extender 150, thereby inverting the ground and digital I/O traces.

In another implementation, the circuit extender 150 includes a ground trace, a first power trace (e.g., a 5V channel), and a second power trace (e.g., a 12V channel) attached to a semi-rigid substrate, such as synthetic polyolefin paper. In this implementation, the circuit extender 150 can connect various classes of power carriers to various components requiring different current and/or voltage supplies for operation, such as a first actuator carrier 120 including a 12V motor and a second actuator carrier 120 including a 3.3V LED. In one example, the first power trace can supply power to a sub-micro size servo, and the second power trace can supply power to a larger linear servo. In this example, the first power trace can be connected to a first power carrier 140 including a removable 1.2V battery, the second power trace can be connected to a second power carrier 140 including a port for a DC power supply, and the ground trace can define a common ground connected to both the first and second power carriers.

However, the circuit extender 150 can define any other suitable number or pattern of perforations, can be of any other suitable material, and can include any other suitable number or geometry of traces.

5. Actuator Carrier

The kit 100 includes an actuator carrier 120 including an actuator substrate 126 defining a first perforation and a second perforation, a conductive circuit extending between the first perforation and the second perforation, and an actuator connected to the actuator substrate 126 and electrically coupled to the circuit. Generally, the actuator carrier 120 includes one or more actuators that output light, sound, mechanical, electrical, thermal, electromagnetic, or any other form of energy according to a power signal received from a power carrier 140, such as via an extender circuit or via the base carrier 110.

In one implementation, the actuator carrier 120 includes: an actuator substrate 126 including a flexible material and defining a row of four perforations, wherein each perforation 102 in the row of four perforations defines a cross-section configured to receive a stud extending from a studded building brick and is offset from an adjacent perforation 102 in the row of four perforations by the standard stud offset distance. In this implementation, the actuator carrier 120 also includes: an actuator mounted to the substrate and defining a first terminal and a second terminal; a first electrically-conductive trace applied over the actuator substrate 126 and extending from a first perforation in the row of four perforations to the first terminal of the actuator; and a second electrically-conductive trace applied over the actuator substrate 126 and extending from a fourth perforation in the row of four perforations to the second terminal of the actuator. Thus, a particular perforation in a section of perforated conductive tape 160 (described below) can be installed over a particular stud extending from the top of a first brick; and the first perforation in the actuator substrate 126 can engage the same stud extending from the first brick—over the perforated conductive tape 160. The first electrically-conductive trace on the actuator carrier 120 can thus electrically couple to the conductive tape layer 168 of the perforated conductive tape 160 when a second brick is installed over the stud, thus constraining the section of perforated conductive tape 160 and the actuator carrier 120 within a stack or assembly of bricks.

In one implementation, the actuator carrier 120 is installed directly over a conduction exclusion zone 104 in the base carrier 110. For example, studs extending from bricks below the base substrate 116 and through perforations in the base substrate 116 can engage perforations in the actuator carrier 120 to align the actuator carrier 120 to the base substrate 116. One or more bricks then installed on top of the actuator carrier 120 thus constrain the actuator carrier 120 relative to the base substrate 116. Alternatively, the actuator carrier 120 can be coupled to neighboring traces across a conduction exclusion zone 104 via a circuit extender 150 of a segment of conductive tap, as described below.

Figure 3A:
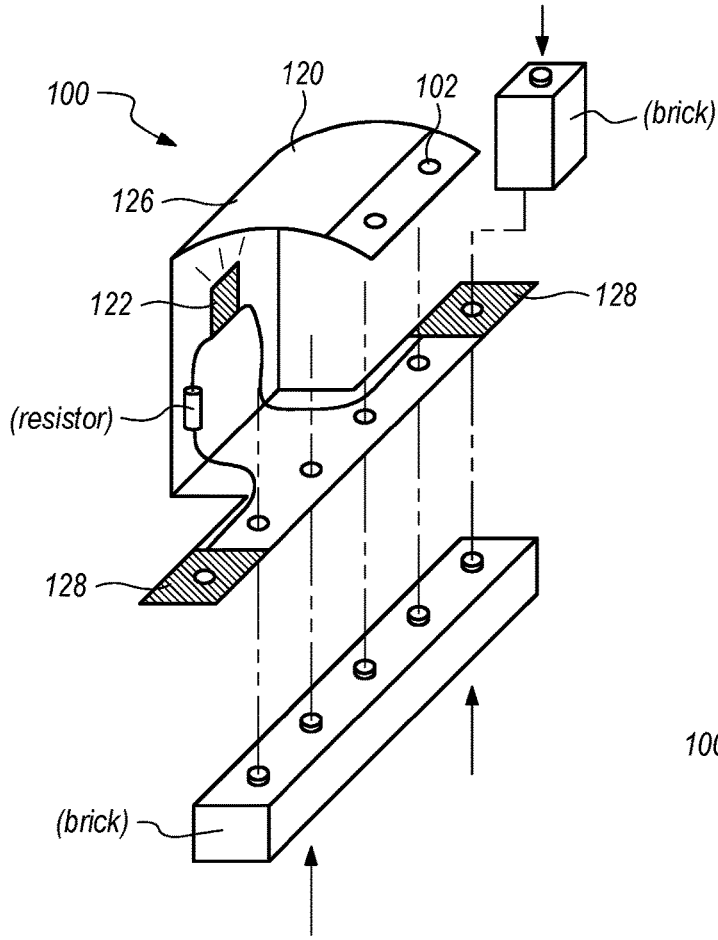
FIGS. 3A and 3B are schematic representations of one variation of the kit.
Figure 3B:
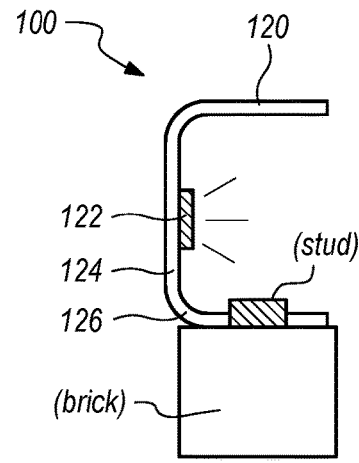
Figure 8A:
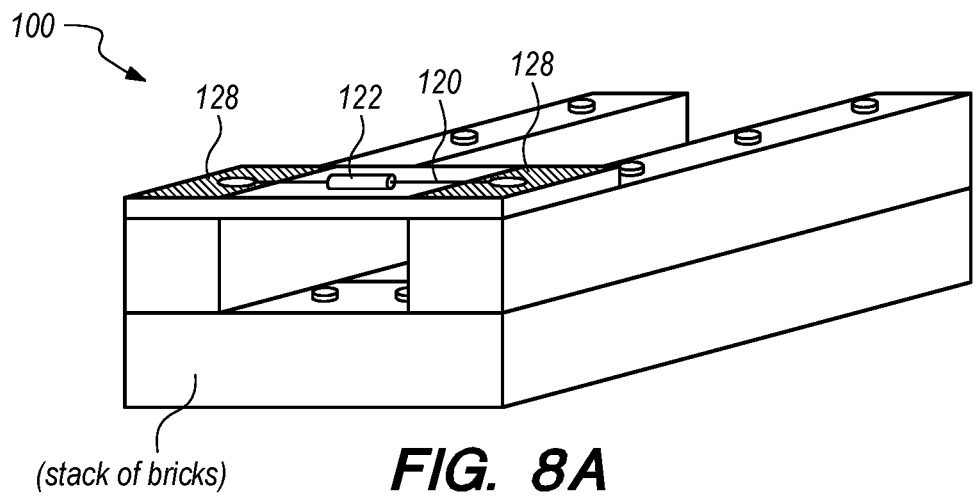
FIGS. 8A and 8B are schematic representations of one variation of the kit.
Figure 8B:
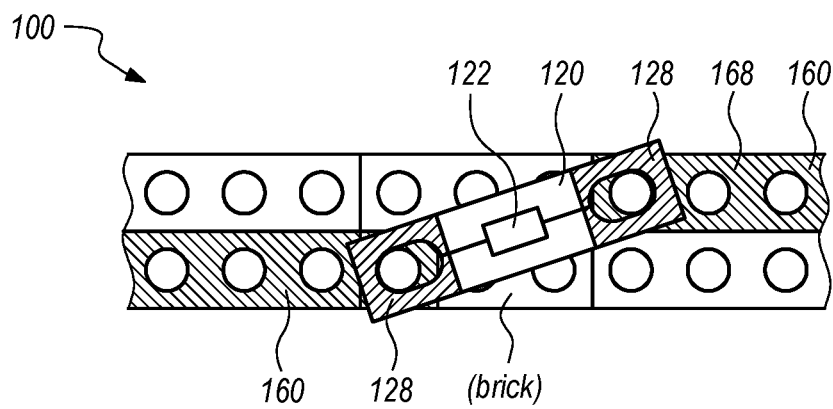
Figure 9:
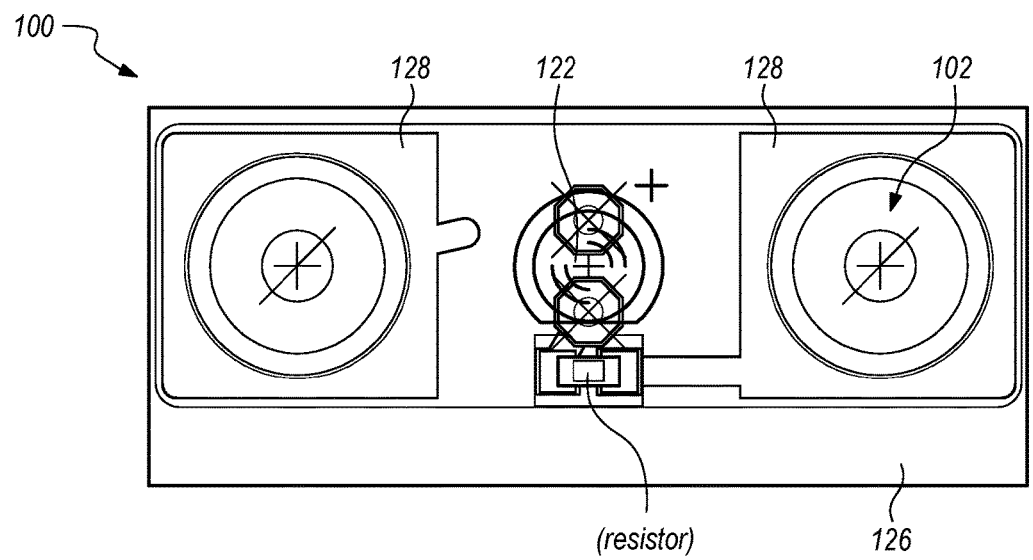
FIG. 9 is a schematic representation of one variation of the kit.

In one example, the actuator carrier 120 includes a 1×4 sensor substrate (i.e., a substrate one one-by in width and four one-bys in length) defining a row of four perforations offset by the stud pitch distance. The actuator carrier 120 further includes a light-emitting diode (or "LED") mounted onto the sensor substrate between the (1,2) and (1,3) perforations, as shown in FIGS. 8A and 9. The actuator carrier 120 includes a first trace encompassing the (1,1) perforation and extending to the first side of the LED and a second trace encompassing the (1,4) perforation and extending to the second side of the LED. In this example, the actuator carrier 120 can be placed underneath or behind a clear brick, and power can be communicated from a power carrier 140 to the LED via a circuit extender 150 or other element connected to the (1,1) and (1,4) perforations on the actuator carrier 120, thereby illuminating the LED from under or behind (as shown in FIGS. 3A and 3B) the transparent brick. Alternatively, the actuator substrate 126 can define a tab extending laterally from a row of perforation, and the actuator (e.g., an LED) can be mounted to the tab (and thus offset laterally from the row of perforations), as shown in FIG. 3A, In the foregoing example, the actuator substrate 126 can define a first perforation 102—in the row of perforations—that forms an elongated bore such that the row of perforations in the actuator substrate 126 can be installed over a single row of studs extending from a studded building brick in a first orientation (shown in FIG. 8A) and installed over (i.e., crossing) two adjacent rows of studs extending from a studded building brick in a second orientation (shown in FIG. 8B). In particular, the actuator carrier 120 can define perforations that are elongated along the long axis of the carrier substrate such that the actuator carrier 120 can be installed non-parallel to a stud row on an adjacent brick, such as in a diagonal orientation on a 2×4 brick. In this example, a (1,1) perforation in the actuator substrate 126 can be installed over a (1,1) stud on the 2×4 brick, and a (1,4) perforation in the actuator substrate 126 can be installed over a (2,4) stud on the 2×4 brick (i.e., at an angle of about 14.5° to the edge of the 2×4 brick). With the LED centered between the (1,2) and (1,3) perforations in the actuator substrate 126, the LED can thus be centered laterally and longitudinally between two adjacent studs in a one-stud-wide wall, and the LED can be similarly centered laterally between two adjacent studs and longitudinally between the edges of a wall in a two-stud-wide wall, as shown in FIG. 8B. In this example, the actuator substrate 126 can also define a scalloped edge configured to fit around adjacent studs when installed in the diagonal orientation.

In another implementation, the actuator carrier 120 can include an audio driver. In one example, the actuator carrier 120 including audio driver (e.g., a speaker, a buzzer) can be installed behind a brick—in the brick building system—that defines vertical openings (e.g., slits) that act as a speaker grille, and the actuator carrier 120 can broadcast sound through the openings in the brick.

In yet another implementation, the actuator carrier 120 includes a motor driver (e.g., a dual H-bridge) and a female receptacle (or a male plug) connected to two (or more) discrete traces encompassing corresponding perforations on the actuator substrate 126. Once installed between bricks, the actuator carrier 120 can be connected to an external motor via a male plug installed in the female receptacle extending from the actuator carrier 120. Alternatively, the actuator carrier 120 can include an integrated motor and motor driver circuit on one actuator substrate 126. For example, the actuator carrier 120 can include a vibrator motor mechanically fastened or bonded to the actuator substrate 126 between (1,1) and (1,4) perforations in the actuator substrate 126, and power can be communicated to the actuator carrier 120 via traces around the (1,1) and (1,4) perforations to power the vibrator motor. In this implementation, the actuator carrier 120 can also include dampening elements to reduce vibration into an adjacent brick structure, such as silicone grommets. When installed in a brick assembly and powered via the power carrier 140, the actuator carrier 120 can thus cause a brick assembly to vibrate and move.

However, the actuator carrier 120 can include any other suitable type of actuator, can define any other shape or geometry, and can include any other number and pattern of perforations and conductive traces.

6. Sensor Carrier

The kit 100 can include a sensor carrier 130 including a sensor substrate defining a first perforation and a second perforation, a conductive circuit extending between the first perforation and the second perforation, and a sensor 132 connected to the sensor substrate and electrically coupled to the circuit. Generally, the sensor carrier 130 can include a sensor 132 and a set of traces extending from power, ground, and/or sensor channels on the sensor 132 to corresponding perforations in the sensor substrate.

In one implementation, the sensor carrier 130 is installed directly over a conduction exclusion zone 104 in the base substrate 116 and is aligned via studs extending from bricks below the base substrate 116 through corresponding perforations in the base substrate 116; bricks then installed on top of the sensor carrier 130 can secure the sensor carrier 130 to the base carrier 110 while holding adjacent traces in alignment. The sensor carrier 130 can additionally or alternatively be offset from the base carrier no and coupled to the base carrier no via one or more circuit extenders or via one or more segments of perforated conductive tape 160 (as described below).

In one example, the sensor carrier 130 includes a sensor substrate defining a 1×4 array of perforations (i.e., a sensor substrate one one-by in width and four one-bys in length) and a mechanical switch electrically coupled to a first discrete trace encompassing a perforations at the (1,1) and electrically coupled to a second discrete trace encompassing a perforation at the (1,3) position on the sensor substrate. In this example, the mechanical switch can be centered between the (1,2) and (1,3) perforations and can be soldered, adhered, or fastened in any other way to the sensor substrate with an adhesive.

In another example, the sensor carrier 130 includes a sensor substrate defining a flexible extension (e.g., a tongue of substrate) extending outwardly from a side of the sensor carrier 130, and the sensor carrier 130 includes a sensor 132 arranged on the flexible extension. In this example, the sensor carrier 130 can includes a photoresistor attached arranged on the flexible extension such that, when the sensor carrier 130 is installed between bricks in the brick building system, the photoresistor is not obstructed by the adjacent brick structure, as shown in FIG. 1. Furthermore, the flexible extension can be manipulated (or reoriented) relative to the brick structure to adjust the field of view of the photoresistor. The photoresistor can thus output a signal corresponding to ambient light levels to another carrier, such as to a base carrier 110 or to an actuator carrier 120 connected via a circuit extender 150. In one such example, when a threshold ambient light level value is detected, the photoresistor can pass a power signal to an adjacent actuator carrier 120 including an LED to selectively actuate the LED based on (e.g., proportionally to) ambient light level.

In a similar example, the sensor substrate can define a relatively long flexible extension, and the sensor carrier 130 can include a temperature sensor installed on the flexible extension. Once the sensor carrier 130 is installed in a brick structure, a user can manipulate the flexible extension to adjust the position of the temperature and a surface or volume to be measured without necessitating positional adjustments to the rest of the brick assembly.

In another example, the sensor carrier 130 can include a radio antenna and a signal conditioning circuit that outputs an analog or digital signal based on a radio signal received through the radio antenna.

However, the sensor carrier 130 can include any other type of sensor configured to output an analog or digital signal according to any other ambient or detected condition. The kit 100 can include multiple similar and/or dissimilar sensor carriers that can be connected in series and/or in parallel with actuator carriers and/or with other sensor carriers.

7. Power Carrier

In one variation shown in FIG. 13, the kit 100 also includes a power carrier 140 that includes: a power substrate 146 defining a set of perforations and a flexible section adjacent the set of perforations, wherein each perforation 102 in the set of perforations defines a cross-section configured to receive a stud extending from a studded building brick and is offset from an adjacent perforation 102 in the set of perforations by the standard stud offset distance. In this variation, the power carrier 140 can further include: a battery 142 adjacent the flexible section of the power substrate 146 opposite the set of perforations and including a first terminal and a second terminal; a first electrically-conductive lead 148 applied over the power substrate 146 and extending from a first perforation in the set of perforations, over the flexible section, to the first terminal of the battery 142; and a second electrically-conductive lead 149 applied over the power substrate 146 and extending from a second perforation in the set of perforations, over the flexible section, to the second terminal of the battery 142.

In this variation, a particular perforation 102—in an array of perforations in a segment of perforated conductive tape 160, described below—can receive a stud extending from the top of a first brick (e.g., in the stack of bricks); the first perforation in the power substrate 146 can engage this same stud over the perforated conductive tape 160; and the first electrically-conductive lead 148—coupled to the first terminal of the battery 142 and extending to the first perforation in the power substrate 146—can electrically couple to the conductive tape layer 168 when a second brick is installed over the stud extending from the top of the first brick, as shown in FIG. 1. Terminals on a battery 142 integrated into the power carrier 140 can thus be electrically coupled to a sensor carrier 130 or an actuator carrier 120 via sections of perforated conductive tape 160 constrained over conductive traces on the power substrate 146 with bricks assembled on each side of the power carrier 140. This power carrier 140 can be similarly assembled over and electrically connected to a base carrier no. The power carrier 140 can also define a flexible substrate section and flexible traces that enable a user to fold the battery 142 out of plane with a section of perforated conductive tape 160 or out of plane with a base carrier no, such as to hide the battery 142 between a narrow hollow wall constructed with stacks of bricks in a larger assembly of bricks.

The kit 100 includes a power carrier 140 including a power substrate 146 defining a first perforation and a second perforation, a conductive circuit extending between the first perforation and the second perforation, and a power source connected to the power substrate 146 and electrically coupled to the circuit. Generally, the power carrier 140 functions to supply electrical current to various components within the kit 100. The power carrier 140 can include or can be configured to couple to a power source, such as a non-rechargeable battery, a rechargeable battery, an AC power adapter.

In one example, the power carrier 140 includes a battery 142 receiver configured to transiently receive a battery 142, such as a rechargeable or non-rechargeable battery, as shown in FIG. 1. The battery receiver and traces on the power carrier 140 can connect terminals on the battery 142 to corresponding perforations on the power substrate 146 when the battery 142 is installed in the battery receiver.

The power carrier 140 can alternatively include an integrated (e.g., non-removable) battery 142 including a ground terminal electrically coupled to a first perforation on the power substrate 146 and a positive-voltage terminal electrically coupled to a second perforation on the power substrate 146. In this example, the power carrier 140 can include a power substrate 146 of four one-by widths and eight one-by lengths, with a void space in the center. The power carrier 140 can also include a battery recharging circuit electrically coupled to the first perforation on the power substrate 146 and to a third perforation on the power substrate 146. For example, to recharge the battery 142 via the integrated battery recharging circuit, a user can connect the first and third perforations to a regulated power source (e.g., a 5V, 500 mA power source), and the power source can supply voltage and power to the battery 142 (e.g., a lithium-ion battery) according to a recharging schedule for the battery 142; the user can then connect the first and second perforations on the power carrier 140 to one or more base, actuator, and/or sensor carriers to supply power to the circuit.

8. Perforated Conductive Tape

Figure 10:
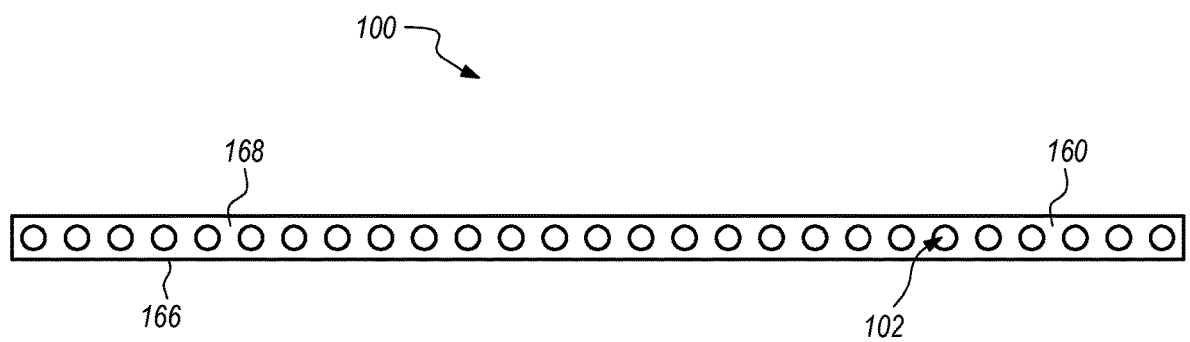
FIG. 10 is a schematic representation of one variation of the kit.

As shown in FIG. 10, one variation of the kit 100 for electrifying a stack of bricks in a studded-brick building system includes a perforated conductive tape 160 including a tape substrate 166 and a perforated conductive layer 168. The tape substrate 166 includes a flexible material and defines a first linear array of perforations, wherein each perforation 102 in the first linear array of perforations: defines a circular cross-section configured to receive a stud extending from a brick in the studded-brick building system; and is offset from an adjacent perforation 102 in the linear array by a standard stud offset distance between studs extending from the brick. The perforated conductive layer 168: is applied over the tape substrate 166; includes an electrically-conductive material extending along the first linear array of perforations; and cooperates with the substrate to define a total nominal thicknesses less than a thickness of the studded building brick. In this variation, the perforated conductive tape 160 is configured to transiently install horizontally between bricks in the stack of bricks to communicate electrical current laterally across the stack of bricks; and the perforated conductive tape 160 is configured to be transiently bent perpendicular to the length of the first linear array of perforations and to transiently install vertically between bricks in the stack of bricks to communicate electrical current vertically through the stack of bricks.

Figure 11:
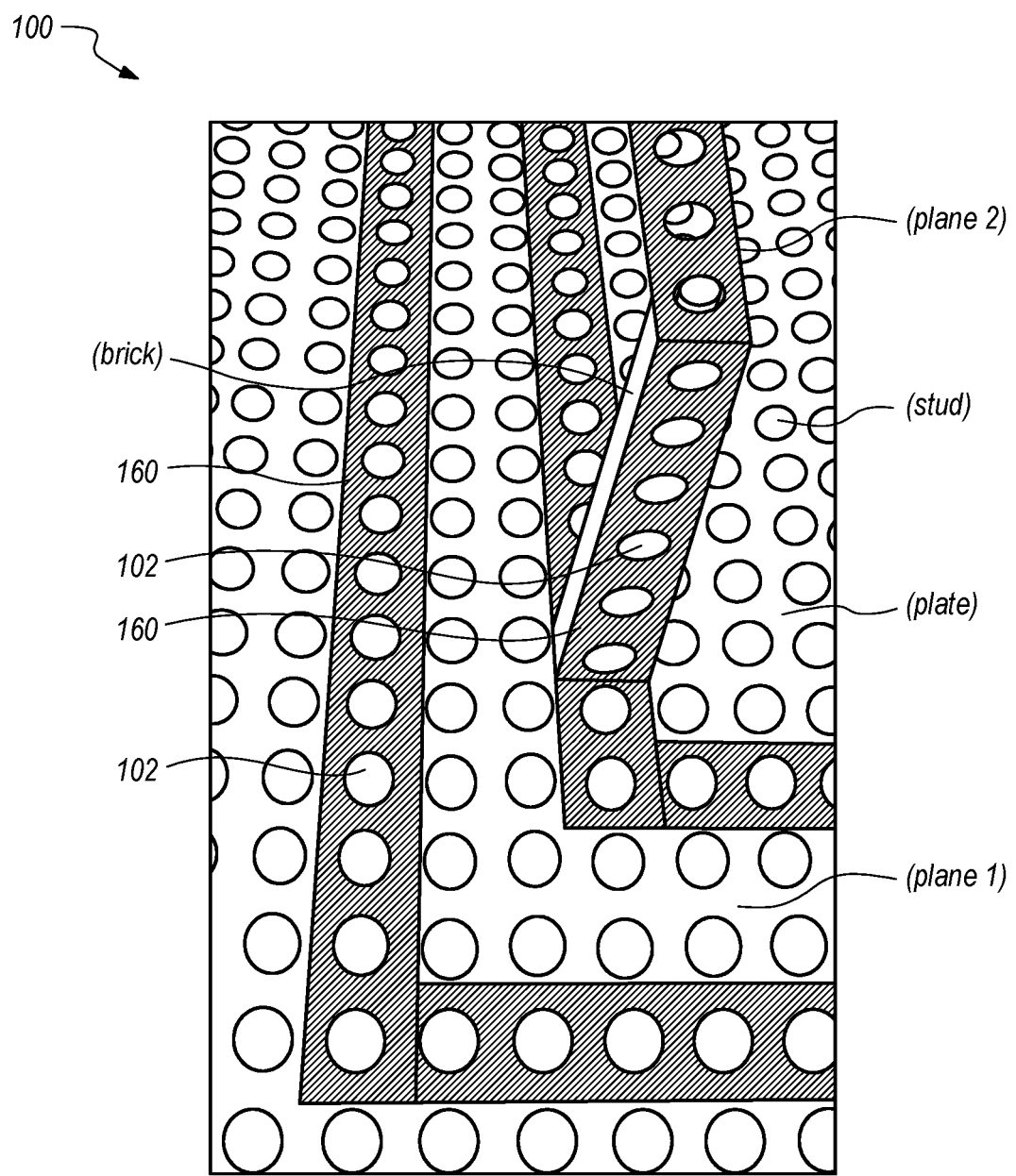
FIG. 11 is a schematic representation of one variation of the kit.

Generally, in this variation, the strip of perforated conductive tape 160 can be installed between and can electrically connect two or more components in the kit 100, such as horizontally and/or vertically within a stack or assembly of bricks. A strip of perforated conductive tape 160 can be cut, folded, bent, or otherwise modified to extend an electrical circuit defined by the kit 100 over custom lateral, longitudinal, and/or vertical distances. For example, a strip of perforated conductive tape 160 can be installed within an assembly of bricks and plates to extend a circuit up to multiple horizontal planes within a stack of bricks (i.e., between the horizontal junctions between stacked bricks) and to extend the circuit laterally and longitudinally across each of these horizontal planes, as shown in FIG. 11. In particular, the kit 100 can include one or more strips of perforated conductive tape 160 that can carry electricity vertically between rows of bricks at different heights within an assembly, and each strip of perforated conductive tape 160 can define perforations at regular intervals such that each strip of perforated conductive tape 160 can fit over studs on a baseplate or adjacent brick.

8.1 Geometry

In one implementation, the strip of perforated conductive tape 160 includes an array of perforations and a single conductive trace that extends along the length of one side of the strip of perforated conductive tape 160 and encompasses the perforations. Alternatively, the perforated conductive tape 160 can include a first conductive tape layer 168 applied over a first side of the tape substrate 166 and a second conductive tape layer 168 applied over a second side of the tape substrate 166 opposite the first side of the tape substrate 166. In this implementation, the first and second conductive tape layers can be electrically coupled or electrically isolated to enable two separate electrical (digital or analog) channels to be communicated over a single section of the perforated conductive tape 160

Figure 6:
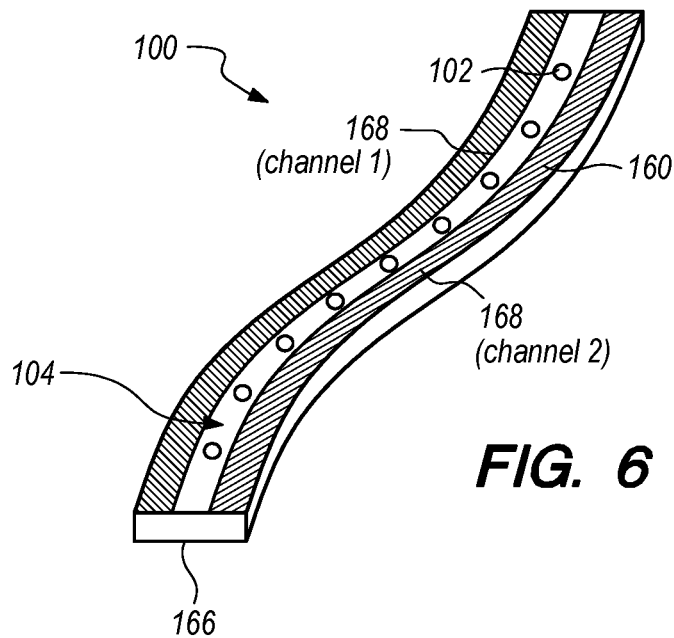
FIG. 6 is a schematic representation of one variation of the kit.

Yet alternatively, the strip of perforated conductive tape 160 can includes multiple discrete conductive traces. For example, the strip of perforated conductive tape 160 can include one row of perforations extending along its length and two discrete parallel traces running on each side of the row of perforations, as shown in FIG. 6. In this example, the base carrier 110, sensor carrier 130, actuator carrier 120, and/or other component(s) within the system can similarly include parallel traces that extend along rows of perforations (but do not encompass perforations) in their corresponding substrates. In another example, the strip of perforated conductive tape 160 can include three parallel rows of perforations extending along its length, and the strip of perforated conductive tape 160 can include a left trace encompassing the left row of perforations, a right trace encompassing the right row of perforations, and a conduction exclusion zone 104 between the left and right traces. In another example, the strip of perforated conductive tape 160 can include a first, a second, and a third discrete trace configured to carry ground, power, and digital I/O signals, respectively.

For example, the tape substrate 166 of the perforated conductive tape 160 can define: a first linear array of perforations, as described above; a second linear array of perforations parallel to the first linear array of perforations; and a third linear array of perforations parallel to and interposed between the first linear array of perforations and the second linear array of perforations. In this example, the conductive tape layer 168 of the perforated conductive tape 160: can include a first conductive tape layer 168 including electrically-conductive material extending along the first linear array of perforations; can include a second conductive tape layer 168 including electrically-conductive material extending along the second linear array of perforations; and can define a conduction exclusion zone 104 along the third linear array of perforations between the first linear array of perforations and the second linear array of perforations. In this example, the conductive tape layer 168 can communicate a first electrical signal over the first conductive tape layer 168 and can communicate a second electrical signal over the second conductive tape layer 168.

A conductive trace on the strip of perforated conductive tape 160 can extend along both the top and bottom faces of the strip of perforated conductive tape 160. Alternatively, the strip of perforated conductive tape 160 can be insulated on one side, and the discrete traces can be insulated on the opposite side of the strip of perforated conductive tape 160. Yet alternatively, the strip of perforated conductive tape 160 can include a first exposed trace on one side, a second exposed trace on the opposite side of the strip of perforated conductive tape 160, and an insulator interposed between the first and second traces, as shown in FIG. 4. Traces on the strip of perforated conductive tape 160 can also be insulated with a removable insulator on one or both sides of the strip of perforated conductive tape 160.

8.2 Materials and Manufacturing

In one implementation, a roll of perforated conductive tape 160 is formed on conductive fabric or on conductive glass cloth, such as metal-coated glass cloth. In this implementation, a one-by-wide strip is cut from a raw roll conductive fabric or glass cloth with a lathe slitter and then punched with a punch press to form a one-by strip of perforated conductive tape 160 with a single row of perforations. A strip of conductive fabric or glass cloth can be punched with a linear die to form a strip of perforated conductive tape 160 in a single punch cycle, or strips of conductive fabric or glass cloth can be processed with a wheel die to form strips of perforated conductive tape 160 of various lengths. Alternatively, a strip of conductive fabric or conductive glass cloth can be trimmed with a laser cutter to produce a perforated strip of perforated conductive tape 160.

In another implementation, a strip of perforated conductive tape 160 is formed on a strip of FR4 0.01", Kapton tape, or other thin, flexible PCB substrate material. For example, a strip of flexible PCB substrate can be plated in copper or other conductive material, and vias can be formed in the strip of flexible PCB substrate to electrically couple conductive layers on both sides of the strip of flexible PCB substrate. The strip of flexible PCB substrate can be drilled mechanically, stamped, laser cut, or scored according to PCB production techniques, etc. to form the array of perforations.

Similarly, the tape substrate 166 of the perforated conductive tape 160 can be of a polymer, such as polyethylene terephthalate ("PET"), and the conductive tape layer 168 of the perforated conductive tape 160 can include a layer of copper (e.g., ten-micron-thick copper plating) plated over the tape substrate 166.

Alternatively, a strip of perforated conductive tape 160 can be formed in fabric or tear-resistant paper, such as 7-mil Teslin with conductive ink deposited across one or both broad surfaces. In another example, the strip of perforated conductive tape 160 can include a strip of copper taffeta stamped with a punch to form the array of perforations.

In yet another implementation, the tape substrate 166 of the perforated conductive tape 160 can include a strip of perforated paper (e.g., wood cellulose-based white paper), and the conductive tape layer 168 of the perforated conductive tape 160 can include conductive ink applied to paper. For example, an 8.5" by 11.5" sheet of paper can be perforated with a square grid array of perforations laterally and longitudinally offset according to the standard stud offset distance and provided (e.g., shipped) to a user with a pen containing conductive ink. The user can create a new trace on the paper by circling two perforations and drawing a line between these two circles with conductive ink dispensed from the pen. The user can cut a rectangular strip— including the new trace—from the paper with scissors to create a new section of custom perforated conductive tape 160 and then install the new section of custom perforated conductive tape 160 between a stack of bricks. In this implementation, the kit 100 can thus include a perforated, nonconductive sheet (e.g., of paper, a polymer, fabric, or any other material) and a pen containing conductive ink; the user can thus create custom strips of perforated conductive tape 160 (or base substrates, actuator carriers, etc.) in straight, L-shaped, T-shaped, curved, rectangular, square, round, and/ or other profiles by drawing conductive traces over relevant areas of the perforated, nonconductive sheet and then trimming these sections out of the sheet with handheld paper scissors or shears.

The base carrier 110, sensor carrier 130, actuator carrier 120, circuit extender 150, and/or other components within the system can be fabricated or formed in similar materials and according to similar methods and techniques. For example, a user can create a complete circuit by drawing conductive traces on a perforated paper sheet with the conductive ink pen and then clamping an actuator, leads of a battery, a switch, etc. to the perforated sheet between bricks in the studded brick building system.

8.3 Manual Perforator and Cutter

In one implementation in which the strip of perforated conductive tape 160 is supplied in rolls or in relatively long sections, the perforated conductive tape 160 can be cut to length manually by a user, such as with scissors. For example, the perforated conductive tape 160 can be supplied in a five-foot roll, can be manually sectioned into strips with scissors, and manually flatted (i.e., formed into a planar strip) against a table surface by a user. Alternatively, the strip of perforated conductive tape 160 can be sectioned with a cutter, such as featuring a mechanism for perforating the perforated conductive tape 160 substrate. The cutter can include a pair of cutting jaws, including a lower cutting jaw and an upper cutting jaw. The lower cutting jaw can include a stud configured to receive a perforation 102 in a strip of perforated conductive tape 160 installed in the tape cutter and a blade receiver adjacent and offset from the stud by half of the center-to-center distances between adjacent perforations in the perforated conductive tape 160 strip. The upper cutting jaw can include a blade pivotally or translationally coupled to the lower cutting jaw and configured to insert the blade into the blade receiver when the tape cutter is actuated. Thus, when a strip (or roll) of perforated conductive tape 160 is installed on the stud and the cutting jaws actuated (e.g., manually by a user), the blade can sever the strip of perforated conductive tape 160 substantially centered between two adjacent perforations in the perforated conductive tape 160. A user can therefore cut multiple segments of perforated conductive tape 160 of custom lengths from a strip or roll of perforated conductive tape 160 by inserting the strip or roll of perforated conductive tape 160 in the tape cutter and manually actuated the tape cutter.

The upper cutting jaw can also include a stud receiver configured to accept the stud extending from the lower jaw and to compress a region of perforated conductive tape 160 arranged about the stud as the tape cutter is actuated. For example, the upper cutting jaw can include a spring-loaded receiver that seats over the stud and the perforated conductive tape 160 to constrain the perforated conductive tape 160 in positive as the tape cutter is closed and before the blade contacts the perforated conductive tape 160. In this variation, the lower jaw can also include two (or more) adjacent and offset studs on one side of or centered across the blade receiver; the set of studs can cooperate to (over)constrain a strip of perforated conductive tape 160 installed in the tape cutter. Alternatively, the lower jaw can include a planar flange that engages one edge of a strip of perforated conductive tape 160 installed in the lower jaw to align the strip of perforated conductive tape 160 substantially perpendicular to the blade.

In this variation, the blade in the upper cutting jaw can define a straight edge configured to sever the perforated conductive tape 160 substantially perpendicular to the long axis of the perforated conductive tape 160. The blade can also define additional curvilinear segments configured to cut other geometries along the severed end of a segment of perforated conductive tape 160. For example, the blade can define a straight edge flanked on each side by opposing double-quarter-circular edges configured to both sever a strip of perforated conductive tape 160 into two segments and to form a filet at each corner of the severed ends of both segments of perforated conductive tape 160 in a single actuation cycle. When a segment of perforated conductive tape 160 is thus trimmed and then installed over an assembly of bricks up to a corner stud, a filleted corner of the segment of perforated conductive tape 160 can be offset inwardly from the corner of bricks above and below the strip such that no corner of perforated conductive tape 160—which may be sharp—protrudes from the corner of a brick assembly.

However, in this variation, the perforated conductive tape 160 can define any other geometry and number of perforations and traces, and the kit 100 can include a cutting tool of any other type or configuration suitable for cutting or trimming a strip of perforated conductive tape 160.

8.4 Vertical Travel

As shown in FIG. 11: a first section of a strip of perforated conductive tape 160 can be installed over studs extending upward from a baseplate; and a second section of the perforated conductive tape 160 can be folded at a 90° angle to the first section to extend vertically upward along the vertical face of an adjacent brick, such as to the height of five bricks above the baseplate. In this example, the bent section of the strip of perforated conductive tape 160 can again be folded 90 degrees, and a nearest perforation 102 on the strip can be installed over an adjacent stud to continue the circuit horizontally across a plane offset above the baseplate, such as at a height of five bricks above the baseplate.

In one implementation, the perforated conductive tape 160 defines a thickness less than a standard gap width between two horizontally-adjacent bricks in the stack of bricks to enable the perforated conductive tape 160 to be transiently installed between opposing vertical faces of two immediately-adjacent bricks within an assembly of bricks. For example, the overall length and width of each brick in the building brick system can be 0.1 millimeter shorter than an integer multiple of the standard stud offset distance within the building brick system such that a gap of 0.2 millimeter exists between opposing vertical faces of two bricks assembled immediately next to one another. In this example, the thickness of the perforated conductive tape 160 can be less than 0.2 millimeter, such as between 0.1 and 0.15 millimeter. Because the thickness of the perforated conductive tape 160 is less than a standard gap width between opposing faces of horizontally-adjacent bricks: a length of perforated conductive tape 160 can be (transiently) bent between a first section—including a first subset of perforations—and a second section—including a second subset of perforations. The first section can then be transiently installed horizontally over a linear array of studs extending from the top of a first brick and retained over the first brick with a second brick snapped onto the first brick. The second section can then be arranged within the stack of bricks to extend vertically upward between an end face of the second brick and an adjacent end face of a third brick installed immediately horizontally-adjacent the second brick. The first section of the perforated conductive tape 160 can thus communicate electrical current laterally across the stack of bricks; and the second section of the perforated conductive tape 160 can communicate electrical current vertically between the second brick and the third brick.

Figure 12A:
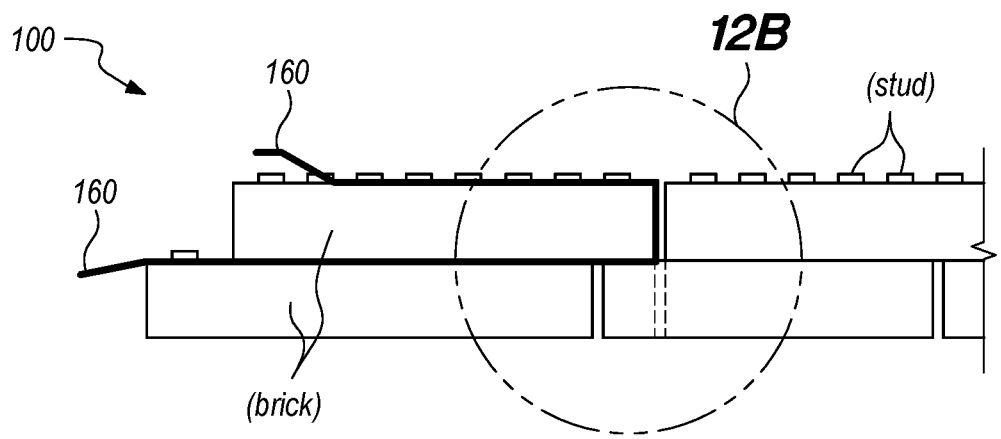
FIGS. 12A and 12B are schematic representations of one variation of the kit.
Figure 12B:
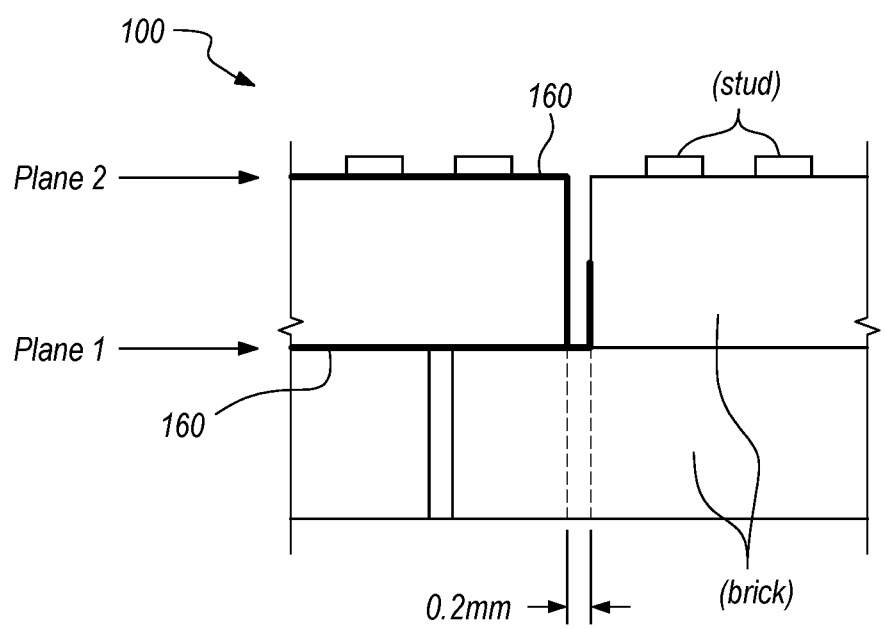

In this foregoing implementation, the perforated conductive tape 160 can substantially equal to (or slightly more than) half of the standard gap width between opposing faces of horizontally-adjacent bricks, such as between 0.08 and 0.11 millimeter in thickness for a standard gap width of 0.2 millimeter. Ends of two sections of perforated conductive tape 160 can thus meet, overlap, and be compressed together to form a satisfactory electrical connection between opposing vertical faces of two horizontally-adjacent bricks. In one example shown in FIGS. 12A and 12B, a first length of perforated conductive tape 160 can be bent at approximately 90° between a first section and a second section, as described above; and a second length of perforated conductive tape 160 can be bent at approximately 90° between a third section and a fourth section. In this example, the first section of the first perforated conductive tape 160 can be installed over a horizontal row of studs along a first brick, and the second section of the first perforated conductive tape 160 can extend upwardly along the vertical face of a second brick installed over the first brick, as described above. The third section of the second perforated conductive tape 160 can be similarly placed along the same vertical face of the second brick adjacent and in contact with the second section of the first perforated conductive tape 160. A third brick can be placed adjacent the second brick to pinch the third section of the second perforated conductive tape 160 against the second section of the first perforated conductive tape 160 to form an electrical connection between the first and second perforated conductive tapes and to communicate electrical current vertically between the second brick and the third brick. The fourth section of the second perforated conductive tape 160 can then be installed horizontally over a row of studs extending from the top of the second brick, the third brick, or a brick placed over the second or third bricks. The first and second perforated conductive tape 160 can thus cooperate to communicate electrical current laterally, vertically, and then laterally (i.e., over a "jog") through a stack of bricks.

8.5 Graphics

In one implementation, the conductive construction tape also includes a graphics layer arranged over the substrate and including symbolic indicators of a direction of current flow through the conductive tape layer 168. For example, the graphics layer can include screen-printed graphics applied to the tape substrate 166 opposite the conductive tape layer 168 and/or applied directly over the conductive tape layer 168. In this example, the graphics layer can include a "+" sign, a "−" sign, and a line between the "+" and "−" signs over every other one-inch length of the conductive construction tape.

Other elements of the kit 100 (e.g., a base carrier 110, a power carrier 140, an actuator carrier 120, a sensor carrier 130) can similarly contain graphics layers that visually indicate electrical terminals on these elements and/or directions of current flow through these elements.

8.6 Rigid Conductive Tape

In one variation, the conductive tape includes a perforated rigid structure, such as a strip of fiberglass plated on one or both sides with copper, gold, nickel, or other conductive material. In this variation, perforations in the conductive tape can also be plated with the conductive material.

9. Custom Circuit

In one variation, the kit 100 includes a custom circuit carrier including a generic (or transparent) substrate defining an array of perforations—patterned laterally and/or longitudinally and offset by a constant center-to-center distance, as described above—but excluding conductive traces. Generally, the custom circuit carrier is configured for installation within an assembly of bricks within the building brick system to define a circuit foundation. A user can install (e.g., adhere) segments of perforated conductive tape 160 onto the custom circuit carrier and over select runs of studs passing through the custom circuit carrier to form routing between components in an electrical circuit. The user can then install one or more actuator carriers, power carriers, sensor carriers, and/or controllers, etc. over studs extending through the custom circuit carrier to complete a custom circuit. Similarly, the user can connect one or more discrete actuator carriers, sensor carriers, power carriers, etc. to the custom circuit carrier, such as via a circuit extender 150 or via segments of perforated conductive tape 160, as described above, to complete the circuit. However, upon deconstruction of the brick assembly, the custom circuit carrier and perforated conductive tape 160 installed therefore can remain in-unit and can be reused when the same, similar, or other brick assembly is constructed. Specifically, segments of perforated conductive tape 160 can be installed on the custom circuit carrier to fabricate a custom base carrier 110, carriers within the kit 100 can be connected to the customer circuit carrier as a brick assembly is constructed, and the custom base carrier 110 can be preserved on top of the generic substrate even after the brick assembly is disassembled.

10. External Connector Carrier

In one variation, the kit 100 includes an external connector carrier including an external connector substrate, a (male or female) header, and two or more traces extending between (e.g., encompassing or running up to) select perforations on the external connector substrate and pins on the header. The external connector carrier can be connected to a base carrier 110, a sensor carrier 130, and/or any other component within the kit 100 via perforations in the external connector substrate and can be connected to an external electrical component, external electrical system, or external processor, etc. via the header. In particular, the external connector carrier can interface the kit 100 with one or more external electrical systems via the header.

11. Digital Sensor Carrier

In one variation, the kit 100 includes a digital sensor carrier 130 including an analog sensor and an analog-to-digital converter that converts the output of the analog sensor to a digital output (e.g., a logic level HI or logic level LO) or to a digital serial output. Like the sensor carrier 130 described above, the digital sensor carrier 130 can include a sensor substrate defining one or more linear arrays of perforations, including two or more perforations encompassed by corresponding conductive traces.

In one implementation, the digital sensor carrier 130 includes a digital sensor circuit including an analog sensor and a signal conditioning circuit, such as an Op-amp comparator circuit, a differential circuit, or a bandpass filter. For example, the digital sensor carrier 130 can include three discrete electrical connections, including a ground port, a voltage supply port, and a digital output port, and the digital sensor carrier 130 can include a sensor substrate one one-by in width and five one-bys in length. In this example, the ground port of the digital sensor carrier 130 can encompass the (1,1) perforation on the sensor substrate, the voltage supply port can encompass the (3,1) perforation on the sensor substrate, and the digital output port can encompass the (5,1) perforation on the sensor substrate. However, in this implementation, ports on the digital sensor carrier 130 can be arranged according to any other permutation of the (1,1,), (1,3), and (1,5) perforation such that each port is offset from an adjacent port by at least one non-conductive perforation. Alternatively, the sensor substrate of the digital sensor carrier 130 can define any other geometry or perforation pattern.

In one example of the foregoing implementation, the digital sensor carrier 130 includes a light sensor that outputs an analog signal based on a magnitude of incident light. In this example, the digital sensor carrier 130 can include a comparator circuit that outputs a logical LO when the output of the light sensor is less than a static threshold voltage (i.e., when the light level is less than a static threshold light level) and that outputs a logical HI when the output of the light sensor is greater than the static threshold voltage (i.e., when the light level is greater than a static threshold light level). Alternatively, in this example, the digital sensor carrier 130 can include a fourth port encompassing another perforation 102 on the sensor substrate (e.g., a (7,1) perforation on a sensor substrate seven one-bys in length) electrically coupled to inverting input of the comparator circuit. A second (analog) sensor carrier 130 including a potentiometer can be electrically connected to a voltage supply carrier on one side and can be connected to the fourth port on the digital sensor carrier 130; a user can then manually adjust the potentiometer on the second sensor carrier 130 to set the threshold voltage for the comparator circuit on the digital sensor carrier 130. The digital output port can be connected directly to a low-current actuator carrier 120 (e.g., an actuator carrier 120 including a small surface-mount LED) or connected to a digital input port on base carrier 110 including a controller or other integrated circuit.

12. Integrated Circuit Carrier

In one variation, the kit 100 includes an integrated circuit ("IC") carrier including an integrated circuit arranged on an IC substrate. The IC carrier can define an array of perforations about its perimeter, as described above, and the IC carrier can also include a set of traces that electrically couple select input and output ("I/O") ports on the integrated circuit to select perforations in the IC substrate.

In one example, the IC carrier includes an IC substrate defining a 3×7 perforation array and includes a 4-bit shift register arranged on the IC substrate. The shift register can include: a ground port connected to the (1,1) perforation on the sheet by a first trace; a power port connected to the (1,3) perforation by a second trace; a digital I/O (e.g., serial-in) port connected to the (1,5) perforation by a third trace; a first parallel digital-out port connected to the (3,1) perforation by a fourth trace; a second parallel digital-out port connected to the (3,3) perforation by a fifth trace; a third parallel digital-out port connected to the (3,5) perforation by a sixth trace; and a fourth parallel digital-out port connected to the (3,7) perforation by a seventh trace. In this example, the (1,1) (1,3), and (1,5) perforations—and therefore the ground, power, and serial-in port on the shift register—can be connected to a base controller via a three-channel circuit extender 150, as described above. In this example, the (3,1) (3,3), (3,5), and (3,7) perforations—and therefore the four digital-out ports on the shift register—can be connected to select carrier actuators within the system via a four-channel circuit extender 150 or via discrete sections of perforated conductive tape 160, as described below.

In another example, the IC carrier similarly includes a multiplexer, such as a four-bit multiplexer including four digital-in ports and one serial-out port installed on an IC substrate of similar geometry and similarly connected to select perforations on the IC substrate.

In yet another example, the IC carrier includes a processor—including multiple digital and analog input and/or output pins—connected to various perforations along the perimeter of the IC substrate, as shown in FIG. 7. In this example, the processor can be connected to various analog and/or digital sensor carriers and/or to various actuator carriers directly or via one or more circuit extenders and/or segments of perforated conductive tape 160, and the components can be held in electrical contact and supported by a set of bricks assembled below, around, and/or above these components. The IC carrier can also include a receptacle or other connection configured to interface the processor to modular third-party electrical circuits (e.g., shields).

As a person skilled in the art will recognize from the previous detailed description and from the figures and claims, modifications and changes can be made to the embodiments of the invention without departing from the scope of this invention as defined in the following claims.

I claim:

1. A kit for electrifying a stack of bricks in a studded-brick building system comprising:
   a construction tape:
      comprising a tape substrate comprising a flexible material and defining a first linear array of perforations, each perforation in the first linear array of perforations:
         defining a circular cross-section configured to receive a stud extending from a brick in the studded-brick building system; and
         offset from an adjacent perforation in the linear array by a standard stud offset distance between studs extending from the brick;
      defining a first surface configured to receive a conductive tape layer:
         applied over the tape substrate;
         comprising an electrically-conductive material extending along the first linear array of perforations; and
         cooperating with the tape substrate to define a total nominal thickness less than a thickness of the studded building brick;
   wherein the construction tape is configured to install between bricks in the stack of bricks.

* * * * *